(12) United States Patent
Higuchi et al.

(10) Patent No.: US 10,622,204 B2
(45) Date of Patent: Apr. 14, 2020

(54) SUBSTRATE PROCESSING APPARATUS AND SUBSTRATE PROCESSING METHOD

(71) Applicant: SCREEN Holdings Co., Ltd., Kyoto (JP)

(72) Inventors: Ayumi Higuchi, Kyoto (JP); Akihisa Iwasaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 365 days.

(21) Appl. No.: 15/354,298

(22) Filed: Nov. 17, 2016

(65) Prior Publication Data

US 2017/0236703 A1    Aug. 17, 2017

(30) Foreign Application Priority Data

Feb. 15, 2016    (JP) .................. 2016-026111

(51) Int. Cl.
*H01L 21/02*      (2006.01)
*H01L 21/67*      (2006.01)
(Continued)

(52) U.S. Cl.
CPC ........ *H01L 21/02057* (2013.01); *B01F 3/088* (2013.01); *B01F 13/1027* (2013.01); *B01F 15/00311* (2013.01); *B05B 1/02* (2013.01); *B05B 12/1418* (2013.01); *B05B 15/25* (2018.02); *B08B 3/02* (2013.01); *B08B 3/08* (2013.01); *B08B 3/10* (2013.01); *G05D 11/132* (2013.01); *H01L 21/02063* (2013.01); *H01L 21/32134* (2013.01); *H01L 21/67051* (2013.01); *H01L 21/67253* (2013.01); *B01F 2003/0896* (2013.01); *B05B 12/02* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2003/0102017 A1* | 6/2003 | Taniyama | B08B 3/02 134/100.1 |
| 2003/0178047 A1* | 9/2003 | Hirae | B08B 1/04 134/26 |
| 2007/0125405 A1 | 6/2007 | Sekiguchi et al. | 134/34 |
| 2007/0169793 A1* | 7/2007 | Shimada | H01L 21/67023 134/26 |
| 2007/0289611 A1* | 12/2007 | Hayashi | H01L 21/02052 134/26 |

(Continued)

FOREIGN PATENT DOCUMENTS

| | | |
|---|---|---|
| JP | 10-070101 A | 3/1998 |
| JP | 2002-241793 A | 8/2002 |

(Continued)

OTHER PUBLICATIONS

A. Iwasaki et al., "Dual-Fluid Spray Process for Particle and Fluorocarbon-Polymer Removal in BEOL Applications," disclosed at the 228th ECS Meeting on Oct. 13, 2005 in Phoenix, Arizona.

*Primary Examiner* — Erin F Bergner
(74) *Attorney, Agent, or Firm* — Ostrolenk Faber LLP

(57) ABSTRACT

A substrate processing apparatus includes a spray nozzle that allows a plurality of liquid droplets to collide with a substrate held by a spin chuck, a liquid piping that supplies a mixed liquid of water and a chemical liquid to the spray nozzle, a first flow control valve and a second flow control valve each of which changes the concentration of the chemical liquid in the mixed liquid, and a controller that causes the liquid piping to supply the mixed liquid having a concentration of the chemical liquid determined in accordance with a substrate to be processed.

12 Claims, 6 Drawing Sheets

(51) Int. Cl.
- *H01L 21/3213* (2006.01)
- *B05B 15/25* (2018.01)
- *B05B 12/14* (2006.01)
- *G05D 11/13* (2006.01)
- *B01F 3/08* (2006.01)
- *B01F 13/10* (2006.01)
- *B01F 15/00* (2006.01)
- *B05B 1/02* (2006.01)
- *B08B 3/02* (2006.01)
- *B08B 3/08* (2006.01)
- *B08B 3/10* (2006.01)
- *H01L 21/311* (2006.01)
- *B05D 1/02* (2006.01)
- *B05D 1/00* (2006.01)
- *B05B 12/02* (2006.01)

(52) U.S. Cl.
CPC ............... *B05D 1/002* (2013.01); *B05D 1/02* (2013.01); *H01L 21/31144* (2013.01)

(56) References Cited

U.S. PATENT DOCUMENTS

| | | | |
|---|---|---|---|
| 2012/0247506 A1* | 10/2012 | Tanaka | H01L 21/02052 134/4 |
| 2013/0014787 A1 | 1/2013 | Urata et al. | 134/100.1 |
| 2013/0052360 A1 | 2/2013 | Maegawa et al. | 427/421.1 |

FOREIGN PATENT DOCUMENTS

| | | |
|---|---|---|
| JP | 2006-080263 A | 3/2006 |
| JP | 2006-086415 A | 3/2006 |
| JP | 2007-157898 A | 6/2007 |
| JP | 2008-108829 A | 5/2008 |
| JP | 4442911 B2 | 3/2010 |
| JP | 5276344 B | 8/2013 |
| JP | 5276344 B2 | 8/2013 |
| JP | 5320244 B2 | 10/2013 |
| KR | 10-2013-0008462 A | 1/2013 |
| KR | 10-2013-0121793 A | 11/2013 |

* cited by examiner

| Substrate information | Concentration |
|---|---|
| X1 | Y1 |
| X2 | Y2 |
| ⋮ | ⋮ |

251

S11 Receive substrate information
S12 Select concentration
S13 Change recipe
S14 Execute processing

SUBSTRATE PROCESSING APPARATUS AND
SUBSTRATE PROCESSING METHOD

STATEMENT REGARDING PRIOR
DISCLOSURES BY THE INVENTOR OR A
JOINT INVENTOR

The basis of the present invention was disclosed by Masanobu Sato at 228th ECS Meeting held on Oct. 13, 2015 at Phoenix Convention Center located in 100 N 3rd Street, Phoenix, Ariz. 85004, United States, based on the papers titled "Dual-Fluid Spray Process for Particle and Fluorocarbon-Polymer Removal in BEOL Applications" which will be submitted in an Information Disclosure Statement.

The authors of the papers include the inventors of the present application, Ayumi Higuchi and Akihisa Iwasaki, and also include Kana Komori, Masanobu Sato and Hajime Shirakawa who obtained the basis of the present invention disclosed directly or indirectly from the inventor of the present application.

BACKGROUND OF THE INVENTION

1. Field of the Invention

The present invention relates to a substrate processing apparatus and a substrate processing method for processing a substrate. Examples of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In a process for manufacturing semiconductor devices, liquid crystal display devices, and the like, a cleaning process is performed to remove foreign matters from a substrate, such as a semiconductor wafer or a glass substrate for liquid crystal display devices.

For example, in a back-end-of-the-line (BEOL) process that forms a multilayer wiring structure on the front surface of a semiconductor wafer on which devices, such as transistors and capacitors, are build, a polymer removing process is performed to remove polymer residues generated by dry etching. The reason is that electric properties of the devices will deteriorate, or the yield will decrease if residues remain on the substrate.

Japanese Patent No. 5276344 discloses a substrate processing apparatus and a substrate processing method that remove particles by allowing liquid droplets of a processing liquid to collide with a substrate. In this substrate processing apparatus and this substrate processing method, a plurality of liquid droplets generated by a collision between HFE (hydrofluoroether) and nitrogen gas are allowed to collide with the front surface of the substrate while supplying pure water serving as a cover-rinsing liquid to the front surface of the substrate. A mixed liquid of pure water and IPA is mentioned as a processing liquid excluding HFE. It is considered that the reason why a low-surface-tension liquid, such as HFE or IPA, is used as a processing liquid is that smaller liquid droplets will be generated, and the number of damage occurrences will decrease if the surface tension of the processing liquid is low.

However, Japanese Patent No. 5276344 discloses generating liquid droplets of the processing liquid by use of the mixed liquid of pure water and IPA instead of HFE, but does not disclose the mixture ratio between IPA and pure water, i.e., the concentration of IPA in the mixed liquid.

If the concentration of IPA rises, a liquid droplet becomes small, and thus a shock applied to a pattern becomes small. However, a shock applied to foreign matters also becomes small. Thus, the removal rate of the foreign matters is lowered while the number of damage occurrences decreases. On the contrary, if the concentration of IPA falls, the number of damage occurrences increases while the removal rate of the foreign matters is heightened. Thus, it is difficult to optimize both the number of damage occurrences and the removal rate of the foreign matters. Particularly, an optimal processing condition for a certain substrate is not always an optimal condition for another substrate, and thus it is not easy to process a plurality of substrates under an optimal condition.

SUMMARY OF THE INVENTION

One preferred embodiment of the present invention provides a substrate processing apparatus that includes a substrate holding unit that holds a substrate, a spray nozzle that generates a plurality of liquid droplets and that allows the plurality of liquid droplets to collide with the substrate held by the substrate holding unit, a mixed-liquid-for-liquid-droplets supply unit that supplies a mixed liquid for liquid droplets to the spray nozzle so as to cause the spray nozzle to generate the plurality of liquid droplets, the mixed liquid for liquid droplets including water and a chemical liquid, the chemical liquid having a smaller surface tension than the water and having a hydrophilic group and a hydrocarbon group, a concentration-for-liquid-droplets changing unit that changes a concentration for liquid droplets that represents a concentration of the chemical liquid in the mixed liquid for liquid droplets to be supplied to the spray nozzle, and a controller that allows the mixed-liquid-for-liquid-droplets supply unit to supply the mixed liquid for liquid droplets having the concentration for liquid droplets determined in accordance with a substrate to be processed to the spray nozzle by controlling the concentration-for-liquid-droplets changing unit.

According to this arrangement, a plurality of liquid droplets are generated from a mixed liquid for liquid droplets that includes water and a chemical liquid, and collide with a substrate. Foreign matters adhering to the substrate come off from the substrate by the collision of the liquid droplets. As a result, the foreign matters, such as particles, are removed from the substrate.

The chemical liquid included in the mixed liquid for liquid droplets is a liquid of a substance having a chemical formula including a hydrophilic group and a hydrocarbon group. The hydrophilic group that has a high affinity for water is included in the chemical liquid, and thus water and the chemical liquid are easily mixed together. Additionally, the surface tension of the chemical liquid is lower than the surface tension of water, and thus the surface tension of the mixed liquid for liquid droplets is lowered, and the diameter of the liquid droplet becomes small. As a result, the occurrence of damage is restrained. Still additionally, the hydrocarbon group having a high affinity for organic substances is included in the chemical liquid, and thus, if organic substances, such as polymer residues, are included in foreign matters, it is possible to dissolve foreign matters residing on the substrate into the mixed liquid for liquid droplets. This makes it possible to further reduce the residual volume of the foreign matters, and makes it possible to raise the cleanliness of the substrate.

The number of damage occurrences and the removal rate of foreign matters tend to depend on the diameter of the liquid droplet. The surface tension is included in a factor that influences the diameter of the liquid droplet. When the concentration of a chemical liquid rises, the surface tension of a mixed liquid for liquid droplets is lowered, and the particle diameter (the diameter of the liquid droplet) becomes small, and thus the number of damage occurrences tends to decrease, and the removal rate of foreign matters tends to become small. On the contrary, when the concentration of a chemical liquid falls, the number of damage occurrences tends to increase, and the removal rate of foreign matters tends to rise. Thus, it is difficult to optimize both the number of damage occurrences and the removal rate of foreign matters.

The concentration for liquid droplets showing the concentration of a chemical liquid in a mixed liquid for liquid droplets is determined in accordance with a substrate to be processed. In other words, the concentration for liquid droplets is set at a comprehensively optimal value with respect to the number of damage occurrences and the removal rate of foreign matters. Thus, it is possible to raise the removal rate of foreign matters while decreasing the number of damage occurrences. Additionally, the concentration for liquid droplets is determined in accordance with a substrate to be processed, and thus it is possible to process a plurality of substrates with stable quality.

Water included in a mixed liquid for liquid droplets may be pure water (deionized water), or may be a water-including liquid including water as its main component. Concrete examples of the water-including liquid are carbonated water and hydrogen water. Water may have a room temperature, or may have a temperature higher or lower than a room temperature. These apply to water included in a mixed liquid for cover-rinsing described below.

The hydrocarbon group included in the chemical formula of a chemical liquid may be any one of an alkyl group (methyl group, ethyl group, propyl group, isopropyl group), a vinyl group, and an aryl group, or may be a hydrocarbon group other than these groups. The hydrophilic group included in the chemical formula of a chemical liquid may be any one of a hydroxyl group, a carboxyl group, an amino group, a thiol group, and a sulfo group, or may be a hydrophilic group other than these groups. These apply to a chemical liquid included in a mixed liquid for cover-rinsing described below.

In the preferred embodiment, at least one of the following features may be added to the substrate processing apparatus.

The spray nozzle is a two-fluid nozzle that generates the plurality of liquid droplets by allowing a gas to collide with the liquid.

According to this arrangement, the liquid and the gas collide with each other, and, as a result, a plurality of liquid droplets are generated. When a plurality of liquid droplets are generated by a collision between the liquid and the gas, the diameter of the liquid droplet is easily influenced by the surface tension. Thus, it is possible to effectively change the diameter of the liquid droplet by using a mixed liquid for liquid droplets including a chemical liquid whose surface tension is smaller than water.

The mixed-liquid-for-liquid-droplets supply unit includes a first mixing unit that generates the mixed liquid for liquid droplets by mixing the water and the chemical liquid together and a second mixing unit that is different from the first mixing unit and that is disposed on an upstream side of the spray nozzle and that mixes the mixed liquid for liquid droplets generated by the first mixing unit.

According to this arrangement, the water and the chemical liquid are mixed together, and a mixed liquid for liquid droplets is generated. Thereafter, the mixed liquid for liquid droplets is further mixed, and is supplied to the spray nozzle. In other words, the water and the chemical liquid are mixed together a plurality of times before being supplied to the spray nozzle. Thus, the mixed liquid for liquid droplets in which the water and the chemical liquid are evenly mixed together is supplied to the spray nozzle. If the uniformity of the mixed liquid for liquid droplets supplied to the spray nozzle is lowered, unevenness in particle diameter will spread. Thus, it is possible to raise the stability of processing by raising the uniformity of the mixed liquid for liquid droplets.

The first mixing unit and the second mixing unit may be mixing-units that are identical in kind with each other, or may be mixing-units that are mutually different in kind. For example, if the first mixing unit includes a water inflow port into which the water flows, a chemical liquid inflow port into which the chemical liquid flows, and a flow passage along which the water that has flowed into the water inflow port and the chemical liquid that has flowed into the chemical liquid inflow port move, the second mixing unit may include a piping into which the mixed liquid for liquid droplets generated by the first mixing unit flows and a plate-shaped stirring fin that is disposed in the piping and that is twisted around the center line of the piping.

The controller includes a storage device that stores a recipe including contents of substrate processing and a processing procedure, and the concentration for liquid droplets determined in accordance with a substrate to be processed is included in the recipe.

According to this arrangement, the concentration for liquid droplets determined in accordance with a substrate to be processed is included in the recipe. The controller controls the concentration-for-liquid-droplets changing unit so that a mixed liquid for liquid droplets having a concentration for liquid droplets included in the recipe is supplied to the spray nozzle. As a result, a mixed liquid for liquid droplets having an optimal concentration for liquid droplets is supplied to the spray nozzle.

The controller includes a storage device that stores a table for liquid droplets, the table including a plurality of pieces of substrate information that represents information about a substrate to be processed and the concentrations for liquid droplets that correspond to the plurality of pieces of substrate information, respectively, a communication device that receives the substrate information, a concentration selecting portion that selects the concentration for liquid droplets that corresponds to the substrate information received by the communication device, as the concentration for liquid droplets determined in accordance with the substrate to be processed, from among the concentrations for liquid droplets included in the table for liquid droplets, and a processing executing portion that allows the mixed-liquid-for-liquid-droplets supply unit to supply the mixed liquid for liquid droplets having the concentration for liquid droplets selected by the concentration selecting portion to the spray nozzle.

According to this arrangement, when substrate information about a substrate to be processed is input, a concentration for liquid droplets corresponding to this substrate information is selected from among a plurality of concentrations for liquid droplets included in the table for liquid droplets. Thereafter, the mixed liquid for liquid droplets having the concentration for liquid droplets selected therefrom is supplied to the spray nozzle. As a result, the mixed liquid for liquid droplets having an optimal concentration for liquid droplets is supplied to the spray nozzle.

The substrate information may be transmitted to the communication device from a host computer that controls a plurality of substrate processing apparatuses. When the controller is connected to a measurement unit that measures the shape of a pattern formed on the front surface of a substrate, the substrate information may be transmitted from the measurement unit to the communication device. The measurement unit may be built into the substrate processing apparatus, or may be a device separated from the substrate processing apparatus.

The substrate processing apparatus further includes a cover-rinsing liquid nozzle that discharges a cover-rinsing liquid toward a substrate held by the substrate holding unit when the spray nozzle allows the plurality of liquid droplets to collide with the substrate, and a mixed-liquid-for-cover-rinsing supply unit that supplies a mixed liquid for cover-rinsing that includes water and a chemical liquid having a hydrophilic group and a hydrocarbon group to the cover-rinsing liquid nozzle as the cover-rinsing liquid.

According to this arrangement, when the spray nozzle allows the plurality of liquid droplets to collide with the substrate, the cover-rinsing liquid nozzle supplies the cover-rinsing liquid to the substrate. The plurality of liquid droplets collide with the substrate covered with a liquid film of the cover-rinsing liquid. Thus, a shock applied to a pattern by the collision of the liquid droplets is dispersed. This makes it possible to restrain the occurrence of damage. Additionally, a mixed liquid for cover-rinsing that includes water and a chemical liquid is used as a cover-rinsing liquid, and thus it is possible to dissolve organic substances residing on the substrate into the cover-rinsing liquid. This makes it possible to further reduce the residual volume of foreign matters, and makes it possible to raise the cleanliness of the substrate.

The surface tension of the chemical liquid included in the mixed liquid for cover-rinsing may be equal to or different from the surface tension of water.

The substrate processing apparatus further includes a concentration-for-cover-rinsing changing unit that changes a concentration for cover-rinsing that represents a concentration of the chemical liquid in the mixed liquid for cover-rinsing to be supplied to the cover-rinsing liquid nozzle, and the controller allows the mixed-liquid-for-cover-rinsing supply unit to supply the mixed liquid for cover-rinsing having the concentration for cover-rinsing determined in accordance with a substrate to be processed to the cover-rinsing liquid nozzle by controlling the concentration-for-cover-rinsing changing unit.

According to this arrangement, not only the concentration for liquid droplets but also the concentration for cover-rinsing is determined in accordance with the substrate to be processed. Organic substances residing on the substrate dissolves into the chemical liquid included in the mixed liquid for cover-rinsing. The amount of the organic substances that dissolve into the chemical liquid increases in proportion to an increase in the concentration of the chemical liquid in the mixed liquid for cover-rinsing. However, according to a study made by the present inventors, it has been understood that the relationship between the amount of dissolution of organic substances and the concentration of the chemical liquid is not necessarily a direct-proportion relationship. Thus, it is possible to effectively remove organic substances by determining the concentration for cover-rinsing in accordance with the substrate to be processed.

The concentration for cover-rinsing determined in accordance with the substrate to be processed may be equal to or different from the concentration for liquid droplets determined in accordance with the substrate to be processed.

The controller includes a storage device that stores a recipe showing contents of substrate processing and a processing procedure, and the concentration for cover-rinsing determined in accordance with a substrate to be processed is shown in the recipe.

According to this arrangement, the concentration for cover-rinsing determined in accordance with a substrate to be processed is included in the recipe. The controller controls the concentration-for-cover-rinsing changing unit so that the mixed liquid for cover-rinsing having the concentration for cover-rinsing included in the recipe is supplied to the cover-rinsing liquid nozzle. As a result, the mixed liquid for cover-rinsing having an optimal concentration for cover-rinsing is supplied to the cover-rinsing liquid nozzle.

The controller includes a storage device that stores a table for cover-rinsing, the table including a plurality of pieces of substrate information that show information about a substrate to be processed and the concentrations for cover-rinsing each of which corresponds to each of the pieces of substrate information, a communication device that receives the substrate information, a concentration selecting portion that selects the concentration for cover-rinsing corresponding to the substrate information received by the communication device from among the concentrations for cover-rinsing included in the table for cover-rinsing while regarding the concentration for cover-rinsing corresponding to the substrate information received by the communication device as the concentration for cover-rinsing determined in accordance with a substrate to be processed, and a processing executing portion that allows the mixed-liquid-for-cover-rinsing supply unit to supply the mixed liquid for cover-rinsing having the concentration for cover-rinsing selected by the concentration selecting portion to the cover-rinsing liquid nozzle from the mixed-liquid-for-cover-rinsing supply unit.

According to this arrangement, when substrate information about a substrate to be processed is input, a concentration for cover-rinsing corresponding to this substrate information is selected from among a plurality of concentrations for cover-rinsing included in the table for cover-rinsing. Thereafter, the mixed liquid for cover-rinsing having the concentration for cover-rinsing selected therefrom is supplied to the cover-rinsing liquid nozzle. As a result, the mixed liquid for cover-rinsing having an optimal concentration for cover-rinsing is supplied to the cover-rinsing liquid nozzle.

The concentration for cover-rinsing determined in accordance with the substrate to be processed is equal to the concentration for liquid droplets determined in accordance with the substrate to be processed.

According to this arrangement, the concentration for liquid droplets and the concentration for cover-rinsing are equal to each other, and thus it is merely necessary to prepare only either one of the concentration for liquid droplets and the concentration for cover-rinsing, and the concentration for liquid droplets and the concentration for cover-rinsing are not required to be individually prepared. When the concentration for liquid droplets and the concentration for cover-rinsing are included in the recipe or the table, it is possible to reduce the amount of data to be stored in the controller.

The controller allows the concentration-for-liquid-droplets changing unit to change the concentration for liquid droplets within a range determined in accordance with the substrate to be processed while causing the mixed-liquid-for-liquid-droplets supply unit to supply the mixed liquid for liquid droplets to the spray nozzle.

According to this arrangement, when the spray nozzle generates a plurality of liquid droplets, the concentration for liquid droplets is changed, and the diameter of the liquid droplet and the concentration of a chemical liquid change. A manner in which foreign matters adhere to the substrate is not immutable inmost cases, and includes various modes. Additionally, there is also a case in which foreign matters variously different in size or in kind adhere to the substrate. Thus, it is possible to raise the removal rate of the foreign matters by changing the concentration for liquid droplets when the same substrate is processed.

The substrate processing apparatus further includes a heater that raises a temperature of the mixed liquid for liquid droplets to be supplied from the mixed-liquid-for-liquid-droplets supply unit to the spray nozzle by heating at least one of the water and the chemical liquid before or after the water and the chemical liquid are mixed together.

According to this arrangement, one of or both of water and a chemical liquid are heated by the heater. As a result, the temperature of a mixed liquid for liquid droplets is raised, and the surface tension of the mixed liquid for liquid droplets is lowered. Thus, the mixed liquid for liquid droplets whose surface tension has been lowered by a rise in temperature is supplied to the spray nozzle. Thus, it is possible to lower the surface tension of the mixed liquid for liquid droplets without increasing the ratio of the chemical liquid included in the mixed liquid for liquid droplets.

The heater may heat only one of the water and the chemical liquid, or may individually heat both of the water and the chemical liquid. The heater may heat the mixed liquid for liquid droplets.

The substrate processing apparatus is an apparatus that allows the plurality of liquid droplets to collide with a substrate that has undergone dry etching.

According to this arrangement, a substrate that has undergone dry etching is carried into the substrate processing apparatus. In the dry etching step, polymer residues including organic substances are generated at the side surface of a pattern or at the bottom surface of a concave portion. Thus, in the substrate processing apparatus, a plurality of liquid droplets are sprayed onto the substrate to which polymer residues have adhered. The polymer residues come off from the side surface of the pattern or from the bottom surface of the concave portion because of the collision of the liquid droplets, and dissolve into the chemical liquid included in the liquid residing on the substrate. Thus, it is possible to efficiently remove the polymer residues from the substrate.

Another preferred embodiment of the present invention provides a substrate processing apparatus that includes a substrate holding unit that holds a substrate, a spray nozzle that generates a plurality of liquid droplets and that allows the plurality of liquid droplets to collide with the substrate held by the substrate holding unit, a cover-rinsing liquid nozzle that discharges a cover-rinsing liquid toward the substrate held by the substrate holding unit when the spray nozzle allows the plurality of liquid droplets to collide with the substrate, and a mixed-liquid-for-cover-rinsing supply unit that supplies a mixed liquid for cover-rinsing that includes water and a chemical liquid having a hydrophilic group and a hydrocarbon group to the cover-rinsing liquid nozzle as the cover-rinsing liquid.

According to this arrangement, a plurality of liquid droplets are sprayed onto a substrate. Foreign matters adhering to the substrate come off from the substrate because of the collision of the liquid droplets. As a result, the foreign matters, such as particles, are removed from the substrate. Additionally, when the spray nozzle allows the plurality of liquid droplets to collide with the substrate, the cover-rinsing liquid nozzle supplies a cover-rinsing liquid to the substrate. The plurality of liquid droplets collide with the substrate covered with a liquid film of the cover-rinsing liquid. Thus, a shock applied to the pattern by the collision of the liquid droplets is dispersed. This makes it possible to restrain the occurrence of damage.

The cover-rinsing liquid is a mixed liquid for cover-rinsing that includes water and a chemical liquid. The chemical liquid included in the mixed liquid for cover-rinsing is a liquid of a substance having a chemical formula including a hydrophilic group and a hydrocarbon group. The hydrophilic group that has a high affinity for water is included in the chemical liquid, and thus the water and the chemical liquid are easily mixed together. Additionally, the hydrocarbon group having a high affinity for organic substances is included in the chemical liquid, and thus, if organic substances, such as polymer residues, are included in foreign matters, it is possible to dissolve foreign matters residing on the substrate into the mixed liquid for cover-rinsing. This makes it possible to further reduce the residual volume of the foreign matters, and makes it possible to raise the cleanliness of the substrate.

Still another preferred embodiment of the present invention provides a substrate processing method that causes a plurality of liquid droplets to collide with a substrate, the plurality of liquid droplets generated from a mixed liquid for liquid droplets in which a chemical liquid is mixed at a concentration for liquid droplets, the chemical liquid having a smaller surface tension than water and having a hydrophilic group and a hydrocarbon group, the mixed liquid including the water and the chemical liquid, the substrate processing method including a mixed-liquid-for-liquid-droplets supplying step of supplying the mixed liquid for liquid droplets having the concentration for liquid droplets determined in accordance with a substrate to be processed to a spray nozzle that generates the plurality of liquid droplets, a liquid-droplets generating step of generating the plurality of liquid droplets from the mixed liquid for liquid droplets supplied to the spray nozzle in the mixed-liquid-for-liquid-droplets supplying step, and a liquid-droplets collision step of allowing the plurality of liquid droplets generated in the liquid-droplets generating step to collide with the substrate. According to this method, it is possible to obtain the same operation and effect as mentioned above.

In the preferred embodiment, at least one of the following features may be added to the substrate processing method.

The liquid-droplets generating step is a step of generating the plurality of liquid droplets by allowing a gas to collide with the mixed liquid for liquid droplets supplied to the spray nozzle in the mixed-liquid-for-liquid-droplets supplying step. According to this method, it is possible to obtain the same operation and effect as mentioned above.

The mixed-liquid-for-liquid-droplets supplying step includes a first mixing step of generating the mixed liquid for liquid droplets by mixing the water and the chemical liquid together by a first mixing unit, and a second mixing step of mixing the mixed liquid for liquid droplets generated in the first mixing step by a second mixing unit that differs from the first mixing unit and that is disposed on an upstream side of the spray nozzle. According to this method, it is possible to obtain the same operation and effect as mentioned above.

The substrate processing method further includes a storing step of storing a recipe that includes contents of substrate processing and a processing procedure, and the mixed-liquid-for-liquid-droplets supplying step is a step of supplying the mixed liquid for liquid droplets having the concentration for liquid droplets included in the recipe to the spray nozzle. According to this method, it is possible to obtain the same operation and effect as mentioned above.

The substrate processing method further includes a storing step of storing a table for liquid droplets, the table including a plurality of pieces of substrate information that represents information about a substrate to be processed and the concentrations for liquid droplets that correspond to the plurality of pieces of substrate information, respectively, a communication step of receiving the substrate information, and a concentration selecting step of selecting the concentration for liquid droplets that corresponds to the substrate information received in the communication step, as the concentration for liquid droplets determined in accordance with the substrate to be processed, from among the concentrations for liquid droplets included in the table for liquid droplets, and the mixed-liquid-for-liquid-droplets supplying step is a step of supplying the mixed liquid for liquid droplets having the concentration for liquid droplets selected in the concentration selecting step to the spray nozzle. According to this method, it is possible to obtain the same operation and effect as mentioned above.

The communication step may be a step of receiving the substrate information transmitted from a host computer that controls a plurality of substrate processing apparatuses, or may be a step of receiving the substrate information transmitted from a measurement unit that measures the shape of a pattern formed on the front surface of the substrate.

The substrate processing method further includes a mixed-liquid-for-cover-rinsing supplying step of supplying a mixed liquid for cover-rinsing in which a chemical liquid is mixed at a concentration for cover-rinsing to a cover-rinsing liquid nozzle, the mixed liquid including water and the chemical liquid having a hydrophilic group and a hydrocarbon group, and a cover-rinsing step of allowing the cover-rinsing liquid nozzle to discharge the mixed liquid for cover-rinsing supplied in the mixed-liquid-for-cover-rinsing supplying step toward the substrate in parallel with the liquid-droplets collision step. According to this method, it is possible to obtain the same operation and effect as mentioned above.

The mixed-liquid-for-cover-rinsing supplying step is a step of supplying the mixed liquid for cover-rinsing having the concentration for cover-rinsing determined in accordance with the substrate to be processed to the cover-rinsing liquid nozzle. According to this method, it is possible to obtain the same operation and effect as mentioned above.

The substrate processing method further includes a storing step of storing a recipe that shows contents of substrate processing and a processing procedure, and the mixed-liquid-for-cover-rinsing supplying step is a step of supplying the mixed liquid for cover-rinsing having the concentration for cover-rinsing shown in the recipe to the cover-rinsing liquid nozzle. According to this method, it is possible to obtain the same operation and effect as mentioned above.

The substrate processing method further includes a storing step of storing a table for cover-rinsing, the table including a plurality of pieces of substrate information showing information about a substrate to be processed and the concentrations for cover-rinsing each of which corresponds to each of the plurality of pieces of substrate information, a communication step of receiving the substrate information, and a concentration selecting step of selecting the concentration for cover-rinsing corresponding to the substrate information received in the communication step from among the concentrations for cover-rinsing included in the table for cover-rinsing while regarding the concentration for cover-rinsing corresponding to the substrate information received in the communication step as the concentration for cover-rinsing determined in accordance with the substrate to be processed, and the mixed-liquid-for-cover-rinsing supplying step is a step of supplying the mixed liquid for cover-rinsing having the concentration for cover-rinsing selected in the concentration selecting step to the cover-rinsing liquid nozzle. According to this method, it is possible to obtain the same operation and effect as mentioned above.

The concentration for cover-rinsing determined in accordance with the substrate to be processed is equal to the concentration for liquid droplets determined in accordance with the substrate to be processed. According to this method, it is possible to obtain the same operation and effect as mentioned above.

The mixed-liquid-for-liquid-droplets supplying step is a step of changing the concentration for liquid droplets within a range determined in accordance with the substrate to be processed while supplying the mixed liquid for liquid droplets to the spray nozzle. According to this method, it is possible to obtain the same operation and effect as mentioned above.

The substrate processing method further includes a heating step of raising a temperature of the mixed liquid for liquid droplets to be supplied to the spray nozzle in the mixed-liquid-for-liquid-droplets supplying step by heating at least one of the water and the chemical liquid before or after the water and the chemical liquid are mixed together. According to this method, it is possible to obtain the same operation and effect as mentioned above.

Still another preferred embodiment of the present invention provides a substrate processing method that causes a plurality of liquid droplets to collide with a substrate while supplying a mixed liquid for cover-rinsing in which a chemical liquid is mixed at a concentration for cover-rinsing to the substrate, the chemical liquid having a hydrophilic group and a hydrocarbon group, the mixed liquid including water and the chemical liquid, the substrate processing method including a liquid-droplets collision step of allowing the plurality of liquid droplets to collide with the substrate, a mixed-liquid-for-cover-rinsing supplying step of supplying the mixed liquid for cover-rinsing having the concentration for cover-rinsing determined in accordance with the substrate to be processed to a cover-rinsing liquid nozzle, and a cover-rinsing step of allowing the cover-rinsing liquid nozzle to discharge the mixed liquid for cover-rinsing supplied in the mixed-liquid-for-cover-rinsing supplying step toward the substrate in parallel with the liquid-droplets collision step. According to this method, it is possible to obtain the same operation and effect as mentioned above.

The above and other objects, features, and effects of the present invention will become more apparent from the following detailed description of the preferred embodiments with reference to the attached drawings.

DETAILED DESCRIPTION OF PREFERRED EMBODIMENTS

Figure 1:
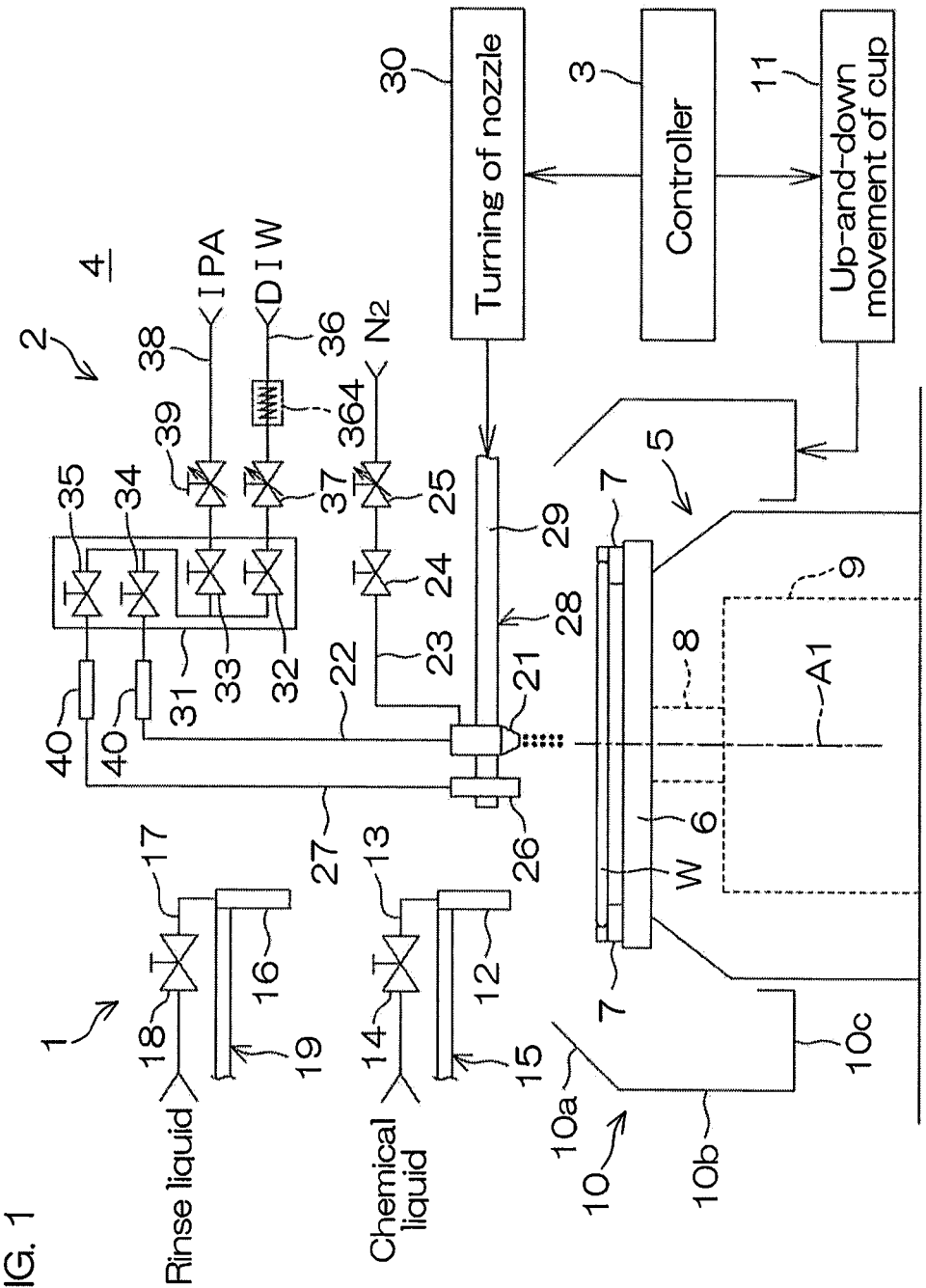
FIG. 1 is a horizontal schematic view of the interior of a processing unit included in a substrate processing apparatus according to a first preferred embodiment of the present invention.

FIG. 1 is a horizontal schematic view of the interior of a processing unit 2 included in a substrate processing apparatus 1 according to a first preferred embodiment of the present invention.

The substrate processing apparatus 1 is a single substrate processing type apparatus in which a disk-shaped substrate W such as a semiconductor wafer is processed one by one. The substrate processing apparatus 1 includes a processing unit 2 that processes the substrate W using a processing fluid such as a processing liquid or a processing gas, a transfer robot (not shown) that transfers the substrate W to the processing unit 2, and a controller 3 that controls the substrate processing apparatus 1.

The processing unit 2 includes a chamber 4 having an internal space, a spin chuck 5 that rotates the substrate W around a vertical rotation axis A1 passing through the center portion of the substrate W while holding the substrate W horizontally inside the chamber 4, a plurality of nozzles that discharge processing liquids toward the substrate W, and a cup 10 that receives a processing liquid having scattered outward from the substrate W. The plurality of nozzles includes a chemical liquid nozzle 12, a rinse liquid nozzle 16, a spray nozzle 21, and a cover-rinsing liquid nozzle 26.

The spin chuck 5 includes a disk-shaped spin base 6 held in a horizontal orientation, a plurality of chuck pins 7 that holds the substrate W in a horizontal orientation above the spin base 6, and a chuck opening/closing mechanism (not shown) that opens and closes the plurality of chuck pins 7. The spin chuck 5 further includes a spin shaft 8 extending downward from a central portion of the spin base 6, and a spin motor 9 that rotates the spin shaft 8 to rotate the substrate W held by the plurality of chuck pins 7 around the rotation axis A1. The spin chuck 5 is not limited to a clamping type chuck in which the plurality of chuck pins 7 are brought into contact with the circumferential end surface of the substrate W, and may be a vacuum type chuck in which the rear surface (lower surface) of the substrate W, which is a non-device forming surface, is suctioned onto an upper surface of the spin base 6 to hold the substrate W horizontally.

The cup 10 includes a cylindrical inclined portion 10a that extends obliquely upwardly toward the rotation axis A1, a circularly cylindrical guide portion 10b that extends downwardly from the lower end (outer end) of the inclined portion 10a, and a liquid receiving portion 10c that forms an annular groove that is upwardly open. The inclined portion 10a includes a circularly annular upper end that is larger in inner diameter than the substrate W and the spin base 6. The upper end of the inclined portion 10a corresponds to the upper end of the cup 10. The upper end of the cup 10 surrounds the substrate W and the spin base 6 in a plan view.

The cup 10 is connected to a cup raising-and-lowering unit 11 that raises and lowers the cup 10. The cup raising-and-lowering unit 11 vertically raises and lowers the cup 10 between an upper position (position shown in FIG. 1) at which the upper end of the inclined portion 10a is placed higher than the position of the substrate W held by the spin chuck 5 and a lower position at which the upper end of the inclined portion 10a is placed lower than the position of the substrate W held by the spin chuck 5. When a liquid, such as a chemical liquid or a rinse liquid, is supplied to the substrate W, the cup 10 is placed at the upper position. The liquid that has been scattered outwardly from the substrate W is received by the inclined portion 10a, and is then gathered into the liquid receiving portion 10c by the guide portion 10b.

The chemical liquid nozzle 12 is connected to a chemical liquid piping 13 that guides the chemical liquid to be supplied to the chemical liquid nozzle 12. A chemical liquid valve 14 is interposed in the chemical liquid piping 13 and switches between supplying and stopping the supply of the chemical liquid with respect to the chemical liquid nozzle 12. When the chemical liquid valve 14 opens, the chemical liquid is continuously discharged downward from the chemical liquid nozzle 12. The chemical liquid to be supplied to the chemical liquid nozzle 12 is a liquid containing at least one of the sulfuric acid, acetic acid, nitric acid, hydrochloric acid, hydrofluoric acid, phosphoric acid, aqueous ammonia, hydrogen peroxide solution, organic acid (e.g., citric acid or oxalic acid), organic alkali (e.g., TMAH: tetramethylammonium hydroxide), surfactant, and corrosion inhibitor, for example.

The chemical liquid valve 14 includes a valve body that defines a flow passage, a valve element disposed in the flow passage, and an actuator that moves the valve element, each of which is not shown. The same applies to valves described below. The actuator may be a pneumatic actuator or an electrically-operated actuator, or may be an actuator excluding these actuators. The controller 3 opens and closes the chemical liquid valve 14 by controlling the actuator. Additionally, the controller 3 changes the opening degree of a flow control valve, such as a gas flow control valve 25, by controlling the actuator.

The chemical liquid nozzle 12 is a scan nozzle that is movable inside the chamber 4, for example. The chemical liquid nozzle 12 is connected to a first nozzle moving unit 15 that moves the chemical liquid nozzle 12 in at least one of the vertical direction and the horizontal direction. The first nozzle moving unit 15 moves the chemical liquid nozzle 12 horizontally between a processing position at which the chemical liquid discharged from the chemical liquid nozzle 12 lands on the upper surface of the substrate W and a retreat position at which the chemical liquid nozzle 12 is positioned around the spin chuck 5 in a plan view.

The rinse liquid nozzle 16 is connected to a rinse liquid piping 17 that guides the rinse liquid to be supplied to the rinse liquid nozzle 16. A rinse liquid valve 18 is interposed in the rinse liquid piping 17 and switches between supplying and stopping the supply of the rinse liquid with respect to the rinse liquid nozzle 16. When the rinse liquid valve 18 opens, the rinse liquid is continuously discharged downward from the rinse liquid nozzle 16. The rinse liquid to be supplied to the rinse liquid nozzle 16 is pure water (Deionized water), for example. The rinse liquid is not limited to pure water, but may be any of electrolyzed ion water, hydrogen water, ozone water, and hydrochloric acid water at a dilution concentration (for example, approximately 10 to 100 ppm), etc.

The rinse liquid nozzle 16 is a scan nozzle. The rinse liquid nozzle 16 may be a fixed nozzle that is fixed at predetermined position inside the chamber 4. The rinse liquid nozzle 16 is connected to a second nozzle moving unit 19 that moves the rinse liquid nozzle 16 in at least one of the vertical direction and the horizontal direction. The second nozzle moving unit 19 moves the rinse liquid nozzle 16 horizontally between a processing position at which the rinse liquid discharged from the rinse liquid nozzle 16 lands on the upper surface of the substrate W and a retreat position at which the rinse liquid nozzle 16 is positioned around the spin chuck 5 in a plan view.

The spray nozzle 21 is a nozzle that generates a plurality of liquid droplets scattering toward a collision position inside the upper surface of the substrate W. The cover-rinsing liquid nozzle 26 is a nozzle that forms a liquid film with which the collision position is covered. The spray nozzle 21 and the cover-rinsing liquid nozzle 26 are connected to a third nozzle moving unit 28 that moves the spray nozzle 21 and the cover-rinsing liquid nozzle 26 in at least one of the vertical and horizontal directions.

The spray nozzle 21 is a two-fluid nozzle that generates a plurality of liquid droplets scattering downwardly toward the upper surface of a substrate W, for example, by allowing a liquid and a gas to collide with each other in its inside or outside. If the spray nozzle 21 is an outside-mixture type two-fluid nozzle, the spray nozzle 21 includes a liquid discharge port that discharges a liquid toward the upper surface of the substrate W and a gas discharge port that discharges a gas that collides with the liquid discharged from the liquid discharge port.

The spray nozzle 21 is connected to a liquid piping 22 that guides a liquid to be supplied to the spray nozzle 21, and is connected to a gas piping 23 that guides a gas to be supplied to the spray nozzle 21. A gas valve 24 and a gas flow control valve 25 are interposed in the gas piping 23. The gas valve 24 performs switching between the supply and the supply stop of a gas to the spray nozzle 21, and the gas flow control valve 25 changes the flow rate of a gas to be supplied to the spray nozzle 21.

The liquid supplied to the spray nozzle 21 is, for example, a mixed liquid (mixed liquid for liquid droplets) of pure water and IPA, and the gas supplied to the spray nozzle 21 is, for example, a nitrogen gas. The liquid piping 22 corresponds to a mixed-liquid piping that guides the mixed liquid. The temperature of the mixed liquid is, for example, room temperature (20 to 30° C.), and the concentration (volume percent concentration) of IPA in the mixed liquid is, for example, 20% or more and 100% or less. IPA denotes a liquid in which the concentration of isopropyl alcohol is 99.8% or more. IPA is a water-soluble organic solvent whose density is lower than pure water.

The cover-rinsing liquid nozzle 26 is connected to a cover-rinsing liquid piping 27 that guides a cover-rinsing liquid to be supplied to the cover-rinsing liquid nozzle 26. A cover-rinsing liquid in the cover-rinsing liquid piping 27 is supplied to the cover-rinsing liquid nozzle 26, and is discharged downwardly from the cover-rinsing liquid nozzle 26. The cover-rinsing liquid is, for example, a mixed liquid (mixed liquid for cover-rinsing) of pure water and IPA. The concentration, the temperature, and the like of the mixed liquid to be supplied to the cover-rinsing liquid nozzle 26 are the same as those of the mixed liquid to be supplied to the spray nozzle 21. The cover-rinsing liquid nozzle 26 discharges a cover-rinsing liquid toward the landing position inside the upper surface of the substrate W. As a result, a liquid film of the cover-rinsing liquid with which the landing position is covered is formed on the substrate W.

The upstream end of the liquid piping 22 is connected to a mixing valve 31, and the downstream end of the liquid piping 22 is connected to the spray nozzle 21. Likewise, the upstream end of the cover-rinsing liquid piping 27 is connected to the mixing valve 31, and the downstream end of the cover-rinsing liquid piping 27 is connected to the cover-rinsing liquid nozzle 26. The mixing valve 31 is connected to a first piping 36 that guides pure water to be supplied to the mixing valve 31, and is connected to a second piping 38 that guides IPA to be supplied to the mixing valve 31. A first flow control valve 37 that changes the flow rate of pure water to be supplied to the mixing valve 31 is interposed in the first piping 36, and a second flow control valve 39 that changes the flow rate of IPA to be supplied to the mixing valve 31 is interposed in the second piping 38.

The mixing valve 31 includes a plurality of valves that are individually openable and closable and a plurality of flow passages connected to the plurality of valves. FIG. 1 shows an example in which the mixing valve 31 includes four valves, two inlets (first inlet and second inlet), and two outlets (first outlet and second outlet). The four valves include a first upstream valve 32 corresponding to the first inlet, a second upstream valve 33 corresponding to the second inlet, a first downstream valve 34 corresponding to the first outlet, and a second downstream valve 35 corresponding to the second outlet. The downstream end of the first piping 36 is connected to the first inlet, and the downstream end of the second piping 38 is connected to the second inlet. The upstream end of the liquid piping 22 is connected to the first outlet, and the upstream end of the cover-rinsing liquid piping 27 is connected to the second outlet.

Mixers 40 that stir liquids are interposed in the liquid piping 22 and in the cover-rinsing liquid piping 27, respectively. Each of the mixers 40 is disposed at a position that is upstream of the spray nozzle 21 and the cover-rinsing liquid nozzle 26 and downstream of the mixing valve 31. The mixer 40 includes a piping into which a liquid flows and a plate-shaped stirring fin that is disposed in the piping and that is twisted around the center line of the piping, each of which is not shown. A mixed liquid supplied into the piping of the mixer 40 flows along the stirring fin in the downstream direction inside the piping. During this time, the mixed liquid is stirred and is evenly mixed.

When the first upstream valve 32, the second upstream valve 33, the first downstream valve 34 and the second downstream valve 35 of the mixing valve 31 are opened, pure water is supplied from the first piping 36 to the mixing valve 31 at a flow rate corresponding to the opening degree of the first flow control valve 37, and IPA is supplied from the second piping 38 to the mixing valve 31 at a flow rate corresponding to the opening degree of the second flow control valve 39. Pure water and IPA are mixed together in the mixing valve 31, and become a mixed liquid. This mixed liquid is supplied to the liquid piping 22 through the first downstream valve 34, and is supplied to the cover-rinsing liquid piping 27 through the second downstream valve 35.

There is a case in which pure water and IPA are not evenly dispersed in the mixed liquid although these are mixed together inside the mixing valve 31. The mixed liquid of pure water and IPA discharged from the mixing valve 31 is further mixed while flowing through the mixers 40 interposed in the liquid piping 22 and in the cover-rinsing liquid piping 27. Thus, a homogeneous mixed liquid including pure water and IPA is reliably supplied to the spray nozzle 21 and to the cover-rinsing liquid nozzle 26.

The third nozzle moving unit 28 includes a third nozzle arm 29 having its forward end to which the spray nozzle 21 and the cover-rinsing liquid nozzle 26 are attached and a nozzle-horizontally-driving unit 30 that horizontally moves the third nozzle arm 29 so that the spray nozzle 21 passes through the central part of the substrate W in a plan view. The nozzle-horizontally-driving unit 30 is a rotary unit that horizontally turns the third nozzle arm 29 around a rotational axis that vertically extends around the cup 10. The nozzle-horizontally-driving unit 30 may be a slide unit that horizontally moves the third nozzle arm 29 in a parallel manner.

The nozzle-horizontally-driving unit 30 horizontally moves the spray nozzle 21 and the cover-rinsing liquid nozzle 26 between a processing position at which the spray nozzle 21 and the cover-rinsing liquid nozzle 26 are placed above the substrate W and a waiting position at which the spray nozzle 21 and the cover-rinsing liquid nozzle 26 are placed around the cup 10 in a plan view. The processing position includes a central processing position at which a plurality of liquid droplets and the cover-rinsing liquid land on a central part of the upper surface of the substrate W and an outer peripheral processing position at which a plurality of liquid droplets and the cover-rinsing liquid land on an outer peripheral part of the upper surface of the substrate W.

The spray nozzle 21 generates a plurality of liquid droplets scattering toward the collision position inside the upper surface of the substrate W. The cover-rinsing liquid nozzle 26 discharges a cover-rinsing liquid toward the landing position inside the upper surface of the substrate W. Both the spray nozzle 21 and the cover-rinsing liquid nozzle 26 are held by a single arm, i.e., by the third nozzle arm 29, and thus the landing position and the collision position are close to each other. Concerning the rotational direction of the substrate W, the landing position is an upstream position with respect to the collision position.

A cover-rinsing liquid that has landed on the landing position flows to the downstream side of the rotational direction along the upper surface of the rotating substrate W, and forms a liquid film with which the landing position and the collision position are covered. When the spray nozzle 21 generates a plurality of liquid droplets while the cover-rinsing liquid nozzle 26 is discharging a cover-rinsing liquid, the plurality of liquid droplets collide with the collision position covered with the liquid film of the cover-rinsing liquid. As a result, a shock applied to the substrate W by the collision of the liquid droplets is dispersed, and thus the substrate W is restrained or prevented from undergoing a damage occurrence such as pattern collapse.

Figure 2:
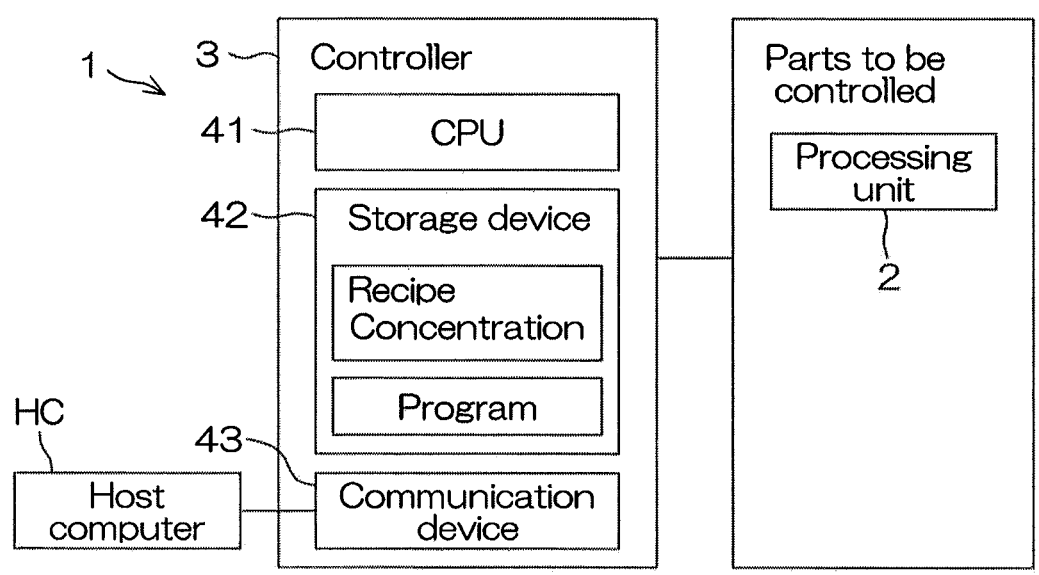
FIG. 2 is a block diagram showing an electric configuration of the substrate processing apparatus.

FIG. 2 is a block diagram showing an electric configuration of the substrate processing apparatus 1.

The controller 3 is a computer that includes a CPU (central processing unit) 41 that executes a program allowing the substrate processing apparatus 1 to process the substrate W in accordance with a recipe that shows the processing contents of the substrate W, a processing procedure, and the like and a storage device 42 that stores various pieces of information including the recipe and the program. The controller 3 additionally includes a communication device 43 that communicates with devices, such as a host computer HC, other than the substrate processing apparatus 1 or with devices disposed in the substrate processing apparatus 1. The host computer HC is a computer that manages a plurality of substrate processing apparatuses disposed in a manufacturing factory that manufactures semiconductor devices, liquid crystal display devices, etc. The substrate processing apparatus 1 is one of a plurality of substrate processing apparatuses. The controller 3 is electrically connected to pieces of equipment, such as the spin chuck 5 and valves provided in the substrate processing apparatus 1. The controller 3 is programmed to allow the substrate processing apparatus 1 to execute various operations necessary to convey or process the substrate W.

Figure 3:
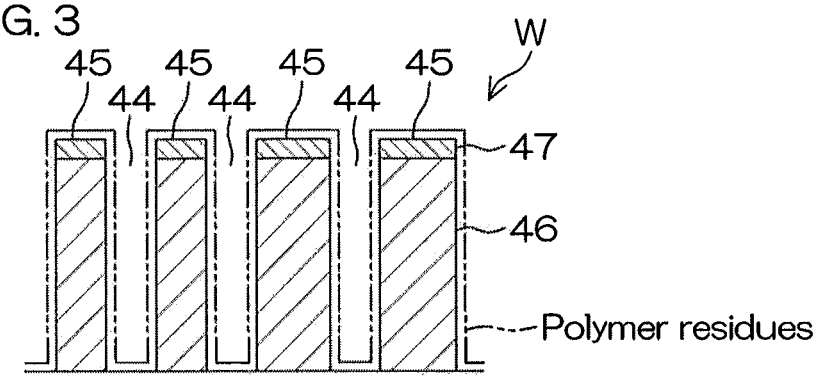
FIG. 3 is a cross-sectional view showing one example of surface states of a substrate that has not yet been processed by the substrate processing apparatus.

FIG. 3 is a cross-sectional view showing one example of surface states of a substrate W that has not yet been processed by the substrate processing apparatus 1.

An example will be hereinafter described in which a substrate W to be processed by the substrate processing apparatus 1 is a semiconductor wafer that has undergone dry etching. A plurality of convex portions 45 partitioned by concave portions 44 are formed on the front surface of the substrate W. The concave portion 44 may be a groove (e.g., wiring groove) that extends in a planar direction of the substrate W, or may be a hole (e.g., via hole) that extends in a thickness direction of the substrate W. The convex portion 45 is a pattern that has a high aspect ratio and that is formed by dry etching. A concrete example of the aspect ratio (pattern height/pattern width) is 6 or more, and a concrete example of the width of the concave portion 44 is 20 nm or less.

FIG. 3 shows an example in which a plurality of patterns that differ in aspect ratio from each other are formed. Additionally, FIG. 3 shows an example in which a hard mask (e.g., TiN film) 47 is formed on an interlayer insulating film 46. Polymer residues generated by dry etching adhere to the side surface of the concave portion 44 or to the bottom surface of the concave portion 44. One example of these residues is polymer residues including fluorocarbon as its main component. A description will be hereinafter given of one example of a processing operation that removes the hard mask 47, residues, and particles from the substrate W.

Figure 4:
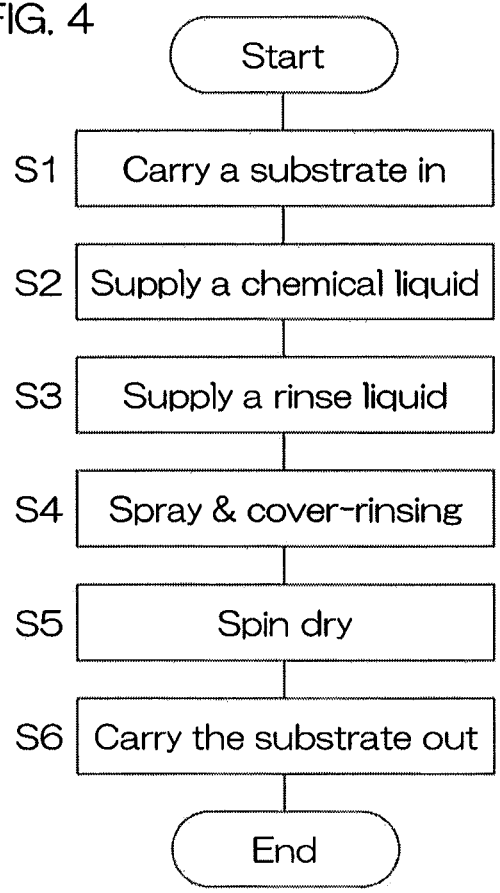
FIG. 4 is a flowchart to describe one example of substrate processing operations performed by the substrate processing apparatus.

FIG. 4 is a flowchart to describe one example of substrate processing operations to process a substrate W performed by the substrate processing apparatus 1. Each step described below is performed by allowing the controller 3 to control the substrate processing apparatus 1. In other words, the controller 3 is programmed to perform each step described below. Reference is hereinafter made to FIG. 1 and FIG. 4.

When a substrate W is processed by the substrate processing apparatus 1, a carrying-in step of carrying the substrate W into the chamber 4 is performed (step S1).

In detail, a transfer robot (not shown) allows a hand to enter the inside of the chamber 4 in a state in which all nozzles have receded from above the substrate W. Thereafter, the transfer robot places the substrate W being on the hand on the spin chuck 5 in a state in which the front surface of the substrate W is directed upwardly. The substrate W is grasped by the chuck pins 7, and then the spin motor 9 starts rotating the substrate W. The substrate W is placed on the spin chuck 5, and then the transfer robot allows the hand to recede from the inside of the chamber 4.

Thereafter, a chemical liquid supply step of supplying a chemical liquid to the upper surface of the substrate W is performed (step S2).

In detail, the first nozzle moving unit 15 moves the chemical liquid nozzle 12 from the retreat position to the processing position. Thereafter, the chemical liquid valve 14 is opened. As a result, a chemical liquid is discharged from the chemical liquid nozzle 12 toward the upper surface of the rotating substrate W. At this time, the first nozzle moving unit 15 may move the chemical liquid nozzle 12 between the central processing position and the outer peripheral processing position, or may bring the chemical liquid nozzle 12 into a standstill state so that the landing position of the chemical liquid is placed at the central part of the upper surface of the substrate W. When a predetermined period of time elapses after the chemical liquid valve 14 is opened, the chemical liquid valve 14 is closed. Thereafter, the first nozzle moving unit 15 moves the chemical liquid nozzle 12 from the processing position to the retreat position.

The chemical liquid discharged from the chemical liquid nozzle 12 lands on the upper surface of the substrate W, and then flows outwardly along the upper surface of the rotating substrate W. As a result, a liquid film of the chemical liquid with which the whole area of the upper surface of the substrate W is covered is formed, and the chemical liquid is supplied to the whole area of the upper surface of the substrate W. Particularly when the first nozzle moving unit 15 moves the chemical liquid nozzle 12 between the central processing position and the outer peripheral processing position, the whole area of the upper surface of the substrate W is scanned in the landing position of the chemical liquid, and thus the chemical liquid is evenly supplied to the whole area of the upper surface of the substrate W. The hard mask 47 (see FIG. 3) formed on the front surface of the substrate W is removed from the substrate W by supplying the chemical liquid.

Thereafter, a rinse liquid supply step of supplying pure water, which is one example of a rinse liquid, to the upper surface of the substrate W is performed (step S3).

In detail, the second nozzle moving unit 19 moves the rinse liquid nozzle 16 from the retreat position to the processing position. Thereafter, the rinse liquid valve 18 is opened. As a result, pure water is discharged from the rinse liquid nozzle 16 toward the upper surface of the rotating substrate W. At this time, the second nozzle moving unit 19 may move the rinse liquid nozzle 16 between the central processing position and the outer peripheral processing position, or may bring the rinse liquid nozzle 16 into a standstill state so that the landing position of the rinse liquid is placed at the central part of the upper surface of the substrate W. The chemical liquid on the substrate W is rinsed away by pure water discharged from the rinse liquid nozzle 16. As a result, a liquid film of pure water with which the whole area of the upper surface of the substrate W is covered is formed. When a predetermined period of time elapses after the rinse liquid valve 18 is opened, the rinse liquid valve 18 is closed. Thereafter, the second nozzle moving unit 19 moves the rinse liquid nozzle 16 from the processing position to the retreat position.

Thereafter, a spray cleaning step of allowing a plurality of liquid droplets to collide with the substrate W and a cover-rinsing step of covering the collision position of the liquid droplets with a cover-rinsing liquid are performed in parallel (step S4).

In detail, the third nozzle moving unit 28 moves the spray nozzle 21 and the cover-rinsing liquid nozzle 26 from the waiting position to the processing position. Thereafter, the first upstream valve 32, the second upstream valve 33, the first downstream valve 34, and the second downstream valve 35 of the mixing valve 31 are opened. Furthermore, the gas valve 24 is opened. As a result, a plurality of liquid droplets scattering toward the upper surface of the substrate W are generated, and a cover-rinsing liquid discharged from the cover-rinsing liquid nozzle 26 is supplied to the upper surface of the substrate W. In this state, the third nozzle moving unit 28 moves the spray nozzle 21 and the cover-rinsing liquid nozzle 26 between the central processing position and the outer peripheral processing position.

The plurality of liquid droplets generated by the spray nozzle 21 collide with the collision position inside the upper surface of the substrate W. The spray nozzle 21 is moved between the central processing position and the outer peripheral processing position while rotating the substrate W, and thus the whole area of the upper surface of the substrate W is scanned with the plurality of liquid droplets, and the plurality of liquid droplets collide with the whole area of the upper surface of the substrate W. Foreign matters (particles and residues) adhering to the upper surface of the substrate W come off from the substrate W because of a shock caused by the collision of the liquid droplets, and the foreign matters are discharged from the substrate W together with a liquid residing on the substrate W.

Furthermore, the cover-rinsing liquid nozzle 26 discharges a cover-rinsing liquid toward the landing position near the collision position while allowing the spray nozzle 21 to spout a plurality of liquid droplets toward the collision position, and thus a state in which the collision position is covered with the cover-rinsing liquid is maintained while the spray nozzle 21 is spouting the plurality of liquid droplets. The plurality of liquid droplets pass through the liquid film with which the collision position is covered, and collide with the collision position. As a result, a shock caused by the collision of the liquid droplets is dispersed, thus making it possible to restrain or prevent a local force from being applied to the pattern.

The liquid supplied to the spray nozzle 21 and to the cover-rinsing liquid nozzle 26 is a mixed liquid of pure water and IPA. The liquid residing on the substrate W is replaced by the mixed liquid supplied from the spray nozzle 21 and from the cover-rinsing liquid nozzle 26. A hydrocarbon group that has an affinity for polymer residues is included in the chemical formulae of IPA. Thus, polymer residues, that have been generated by dry etching and that have been deposited in the pattern, melt in IPA included in the mixed liquid. Thus, residues residing on the substrate W are removed from the substrate W not only by a shock caused by the collision of the liquid droplets but also by the dissolution into IPA residing on the substrate W. This makes it possible to raise the removal rate of the residues.

IPA whose surface tension is smaller than pure water is added to pure water, and thus the surface tension of a liquid (a mixed liquid of pure water and IPA) supplied to the spray nozzle 21 is smaller than the surface tension of pure water. The diameter of a liquid droplet generated by a two-fluid nozzle becomes smaller as the surface tension of a liquid supplied to the two-fluid nozzle becomes lower. If the flow velocity of liquid droplets is the same, the kinetic energy of the liquid droplets decreases in proportion to a reduction in particle diameter, i.e., a reduction in mass. Thus, it is possible to restrain the occurrence of damage, such as pattern collapse, by supplying a mixed liquid of pure water and IPA to the two-fluid nozzle.

From the viewpoint of reducing the number of damage occurrences, it is desirable that the diameter of the liquid droplet generated by the spray nozzle 21 should be smaller. However, if the diameter of the liquid droplet is too small, a shock caused by the collision of the liquid droplet will become weak, and thus the removal rate of particles or residues will decrease although the number of damage occurrences becomes small. In order to increase the kinetic energy of liquid droplets, it is conceivable that the flow rate of a gas to be supplied to the spray nozzle 21 is increased, and yet, if so, the consumption of a gas, such as nitrogen gas, will be increased. Thus, it is necessary to determine the optimum value of the concentration of IPA in a mixed liquid in accordance with the strength of a pattern or in accordance with the adhesion force of foreign matters.

On the other hand, the amount of residues that are dissolved in IPA increases in proportion to an increase in the amount of IPA to be supplied to the substrate W. However, according to a study made by the present inventors, it has been understood that the relationship between the amount of dissolution of residues and the concentration of IPA is not necessarily a direct-proportion relationship. From the viewpoint of removing residues by dissolution, it is desirable that the concentration of IPA in a mixed liquid should be high. However, if the concentration of IPA is too high, the diameter of the liquid droplet will become small, and the removal rate of foreign matters will decrease as described above.

The mixture ratio between pure water and IPA, i.e., the concentration of IPA in a mixed liquid must be determined in consideration of a plurality of factors including the removal rate of particles, the number of damage occurrences, and the removal rate of residues. However, it is difficult to optimize all factors because of the aforementioned reason, and thus it is necessary to determine a comprehensively-optimal IPA concentration in accordance with a substrate W.

In the present preferred embodiment, an optimal IPA concentration is included in a recipe. The IPA concentration in the recipe is an experimentally pre-calculated value. The IPA concentration is constant over the entire period of, for example, the spray cleaning step. The controller 3 controls the opening degree of the first flow control valve 37 and the opening degree of the second flow control valve 39 so that a mixed liquid including IPA is supplied to the spray nozzle 21 at a concentration shown in the recipe. This makes it possible to effectively remove foreign matters including particles and residues from the substrate W while effectively restraining damage occurrences.

When a predetermined period of time elapses after the cleaning of a substrate W by spraying is started, i.e., after the generation of liquid droplets is started, the first upstream valve 32, the second upstream valve 33, the first downstream valve 34, the second downstream valve 35, and the gas valve 24 are closed. At this time, the upper surface of the substrate W is covered with a liquid film of the mixed liquid of pure water and IPA. After the generation of liquid droplets and the discharge of a cover-rinsing liquid are stopped, the third nozzle moving unit 28 moves the spray nozzle 21 and the cover-rinsing liquid nozzle 26 from the processing position to the waiting position.

After the spray cleaning step is performed, a drying step of drying the substrate W is performed (step S5).

In detail, the spin motor 9 rotates the substrate W at a high rotational speed (e.g., several thousand rpm) while accelerating the substrate W in a rotational direction. As a result, a great centrifugal force is applied to a liquid adhering to the substrate W, and the liquid is shaken off from the substrate W toward its surroundings. Thus, the liquid is removed from the substrate W, and the substrate W is dried. When a predetermined period of time elapses after the high-speed rotation of the substrate W is started, the spin motor 9 stops its own rotation. As a result, the rotation of the substrate W is stopped.

Thereafter, a carrying-out step of carrying the substrate W out of the chamber 4 is performed (step S6).

In detail, the transfer robot (not shown) allows the hand to enter the inside of the chamber 4 in a state in which all nozzles have receded from above the substrate W. After the holding of the substrate W by the plurality of chuck pins 7 is released, the transfer robot supports the substrate W residing on the spin chuck 5 by the hand. Thereafter, the transfer robot allows the hand to recede from the inside of the chamber 4 while supporting the substrate W by the hand. As a result, the substrate W that has already been processed is carried out of the chamber 4.

As described above, in the present preferred embodiment, not pure water but a mixed liquid of pure water and IPA is supplied to the spray nozzle 21. As a result, the surface tension of the liquid supplied to the spray nozzle 21 is lowered, and thus a liquid droplet becomes smaller, and the flow velocity of the liquid droplet becomes higher than in a case in which pure water is supplied to the spray nozzle 21. Additionally, unevenness in size and in flow velocity of a liquid droplet is narrowed. Thus, it is possible to reduce the number of large liquid droplets that cause damage and the number of small liquid droplets that do not contribute to the removal of foreign matters. This makes it possible to perform efficient cleaning.

According to a study made by the present inventors, the number of damage occurrences tends to decrease in proportion to an increase in the concentration of IPA in the mixed liquid. The removal rate of particles tends to decrease in proportion to an increase in the concentration of IPA, and yet this is not inverse proportion. The removal rate of residues tends to rise in proportion to an increase in the concentration of IPA, and yet this is not direct proportion. Thus, it is difficult to optimize all factors. In the present preferred embodiment, a mixed liquid including IPA is supplied to the spray nozzle 21 at a comprehensively optimal concentration. The concentration of IPA is determined in accordance with the substrate W. This makes it possible to process a plurality of substrates W with stabilized quality.

IPA included in the mixed liquid is a liquid of a substance having a chemical formula including a hydrophilic group and a hydrocarbon group. The hydrophilic group that has a high affinity for pure water is included in IPA, and thus pure water and IPA are easily mixed together. Additionally, the surface tension of IPA is lower than the surface tension of pure water, and thus the surface tension of the mixed liquid is lowered, and the diameter of the liquid droplet becomes small. As a result, the occurrence of damage is restrained. Still additionally, the hydrocarbon group having a high affinity for organic substances is included in IPA, and thus, if organic substances, such as polymer residues, are included in foreign matters, it is possible to dissolve foreign matters residing on the substrate W into the mixed liquid. This makes it possible to further reduce the residual volume of the foreign matters, and makes it possible to raise the cleanliness of the substrate W.

In the present preferred embodiment, a liquid and a gas collide with each other, and, as a result, a plurality of liquid droplets are generated. When a plurality of liquid droplets are generated by a collision between a liquid and a gas, the particle diameter of the liquid droplet is susceptible to the surface tension of the liquid. Thus, it is possible to effectively change the particle diameter of the liquid droplet by using a mixed liquid including IPA whose surface tension is smaller than pure water.

In the present preferred embodiment, pure water and IPA are mixed together by the mixing valve 31, and a mixed liquid is generated. Thereafter, the mixed liquid is further mixed by the mixer 40, and is supplied to the spray nozzle 21. In other words, pure water and IPA are mixed together a plurality of times before these are supplied to the spray nozzle 21. Thus, a mixed liquid in which pure water and IPA have been evenly mixed together is supplied to the spray nozzle 21. If the uniformity of the mixed liquid to be supplied to the spray nozzle 21 is lowered, unevenness in particle diameter will increase. Thus, it is possible to improve the stability of processing by raising the uniformity of the mixed liquid.

In the present preferred embodiment, the cover-rinsing liquid nozzle 26 supplies a cover-rinsing liquid to the substrate W when the spray nozzle 21 allows a plurality of liquid droplets to collide with the substrate W. The plurality of liquid droplets collide with the substrate W covered with a liquid film of the cover-rinsing liquid. Thus, a shock applied to a pattern by the collision of the liquid droplets is dispersed. This makes it possible to restrain the occurrence of damage. Additionally, a mixed liquid that includes pure water and IPA is used as a cover-rinsing liquid, and thus it is possible to dissolve organic substances residing on the substrate W into the cover-rinsing liquid. This makes it possible to further reduce the residual volume of foreign matters, and makes it possible to raise the cleanliness of the substrate W.

In the present preferred embodiment, not only the concentration of IPA in a mixed liquid to be supplied to the spray nozzle 21 but also the concentration of IPA in a mixed liquid to be supplied to the cover-rinsing liquid nozzle 26 is determined in accordance with a substrate W to be processed. Organic substances residing on the substrate W dissolve into IPA included in the mixed liquid. The amount of the organic substances that dissolve into IPA increases in proportion to an increase in the concentration of IPA in the mixed liquid. However, according to a study made by the present inventors, it has been understood that the relationship between the amount of dissolution of organic substances and the concentration of IPA is not necessarily a direct-proportion relationship. Thus, it is possible to effectively remove organic substances by determining the concentration of IPA in accordance with the substrate W to be processed.

In the present preferred embodiment, the concentration of IPA in a mixed liquid to be supplied to the spray nozzle 21 is equal to the concentration of IPA in a mixed liquid to be supplied to the cover-rinsing liquid nozzle 26, and thus it is merely necessary to prepare only either one of the concentration for liquid droplets and the concentration for cover-rinsing, and the concentration for liquid droplets and the concentration for cover rinsing are not required to be individually prepared. Additionally, mutually different concentrations are not required to be stored, and thus it is possible to reduce the amount of data to be stored in the controller 3.

In the present preferred embodiment, a substrate W that has undergone dry etching is carried into the substrate processing apparatus 1. In the dry etching step, polymer residues including organic substances are generated on the side surface of a pattern (the side surface of the convex portion 45) or on the bottom surface of the concave portion 44. Thus, in the substrate processing apparatus 1, a plurality of liquid droplets are sprayed onto the substrate W to which polymer residues have adhered. The polymer residues come off from the side surface of the pattern or from the bottom surface of the concave portion 44 by the collision of the liquid droplets, and dissolve into IPA included in the liquid residing on the substrate W. Thus, it is possible to efficiently remove the polymer residues from the substrate W.

Second Preferred Embodiment

Figure 5:
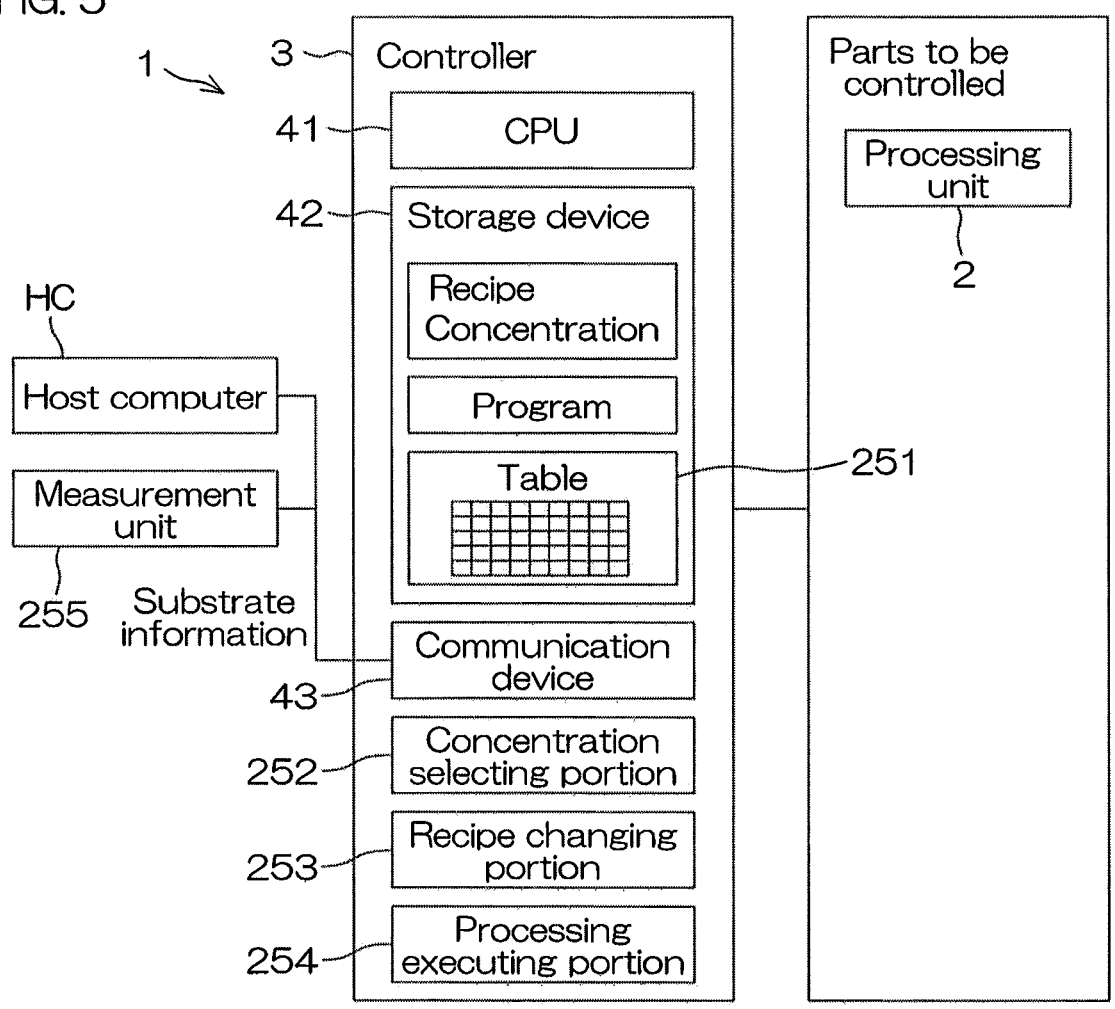
FIG. 5 is a block diagram showing an electric configuration of a substrate processing apparatus according to a second preferred embodiment of the present invention.
Figures 6, 7:
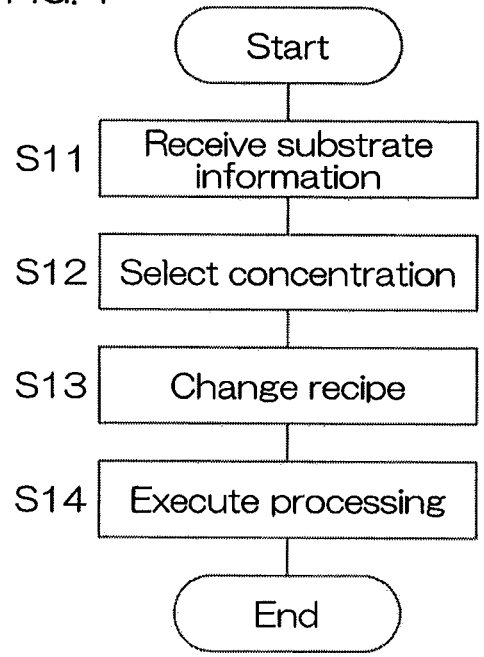
FIG. 6 is a view showing one example of the contents of a table stored in a controller.
FIG. 7 is a flowchart showing the flow from the reception of substrate information to the execution of substrate processing.

Next, a second preferred embodiment of the present invention will be described. In FIG. 5 to FIG. 7 described below, the same reference sign as in FIG. 1 etc., is given to a component equivalent to each component shown in FIG. 1 to FIG. 6 described above, and a description of this component is omitted.

FIG. 5 is a block diagram showing an electric configuration of a substrate processing apparatus 1 according to the second preferred embodiment of the present invention. FIG. 6 is a view showing one example of the contents of a table 251 stored in the controller 3. FIG. 7 is a flowchart showing the flow from the reception of substrate information to the execution of substrate processing.

In the second preferred embodiment, the storage device 42 of the controller 3 stores a table 251 (table for liquid droplets and table for cover-rinsing) showing the relationship between the concentration of IPA in a mixed liquid and substrate information showing information about a substrate W to be processed by the substrate processing apparatus 1, in addition to a recipe and so on. The controller 3 includes a concentration selecting portion 252, a recipe changing portion 253, and a processing executing portion 254 in addition to the CPU 41, the storage device 42, and the communication device 43. The concentration selecting portion 252, the recipe changing portion 253, and the processing executing portion 254 are each a functional block that is realized by allowing the CPU 41 to execute a program stored in the storage device 42.

Pattern information that shows information about a pattern formed on the substrate W and processing information that shows the processing contents and processing conditions of the substrate W performed in the preceding steps (the steps that have been performed until having been conveyed to the substrate processing apparatus 1) are included in the substrate information. At least one of, for example, a pattern shape, a pattern size, a pattern aspect ratio, and a pattern quality-of-material is included in the pattern information. The pattern shape denotes that the pattern is either a linear pattern or a cylindrical pattern.

The substrate information may be transmitted to the controller 3 from the host computer HC through the communication device 43, or may be transmitted to the controller 3 through the communication device 43 from a measurement unit 255 (see FIG. 5) disposed inside or outside the substrate processing apparatus 1. The measurement unit 255 is a unit that measures the shape, the size, etc., of a pattern. The measurement unit 255 includes, for example, a scanning electron microscope (SEM) or an image-recognition foreign-substance inspection device.

As shown in FIG. 6, the table 251 includes a plurality of pieces of substrate information and a plurality of concentrations both of which have a one-to-one relationship with each other. In an example shown in FIG. 6, substrate information X1 and concentration Y1 correspond to each other, and substrate information X2 and concentration Y2 correspond to each other. The concentration included in the table 251 is set at a value at which, when a substrate W having a piece of substrate information corresponding to this concentration is processed, a comprehensively optimal result can be obtained with respect to a plurality of factors including the removal rate of foreign matters including residues and particles and the number of damage occurrences caused by processing. The concentration included in the table 251 is an experimentally pre-calculated value. The controller 3 controls the substrate processing apparatus 1 so that a mixed liquid including IPA at a concentration included in the table 251 is supplied to the spray nozzle 21 and to the cover-rinsing liquid nozzle 26.

In detail, as shown in FIG. 7, when the communication device 43 of the controller 3 receives substrate information (step S11), the concentration selecting portion 252 of the controller 3 selects a concentration (selected concentration) corresponding to the substrate information input into the controller 3 from among a plurality of concentrations included in the table 251 (step S12). For example, when substrate information X1 (see FIG. 6) is input into the communication device 43, the concentration selecting portion 252 selects concentration Y1. Thereafter, the recipe changing portion 253 of the controller 3 replaces a concentration (initial concentration) included in the recipe with the selected concentration (step S13). As a result, the recipe stored in the storage device 42 is changed. Thereafter, the processing executing portion 254 of the controller 3 allows the substrate processing apparatus 1 to process the substrate W in accordance with the recipe that has been changed in the same way as in the aforementioned example of the processing of the substrate W (step S14). As a result, a mixed liquid including IPA at a comprehensively optimal concentration is supplied to the spray nozzle 21 and to the cover-rinsing liquid nozzle 26, and thus it is possible to raise the removal rate of foreign matters while restraining the occurrence of damage.

Other Preferred Embodiments

The present invention is not limited to the contents of the above preferred embodiments, and can be variously modified.

Although a description has been given of the aforementioned preferred embodiment in which, for example, the liquid supplied to the spray nozzle 21 is a mixed liquid of pure water and IPA and in which the gas supplied to the spray nozzle 21 is a nitrogen gas, fluids other than these fluids mentioned above may be supplied to the spray nozzle 21. Liquids other than the mixed liquid of pure water and IPA may be supplied to the cover-rinsing liquid nozzle 26.

Although a description has been given of the aforementioned preferred embodiment in which the mixed liquid supplied to the spray nozzle 21 and to the cover-rinsing liquid nozzle 26 includes two kinds of liquids (pure water and IPA), the mixed liquid may include three or more kinds of liquids.

The concentration of IPA in the mixed liquid is not necessarily required to be constant over the entire period of the spray cleaning step (step S4 of FIG. 4). In other words, the controller 3 may continuously or stepwisely change the concentration of IPA during at least one part of the entire period of the spray cleaning step.

Figure 8:
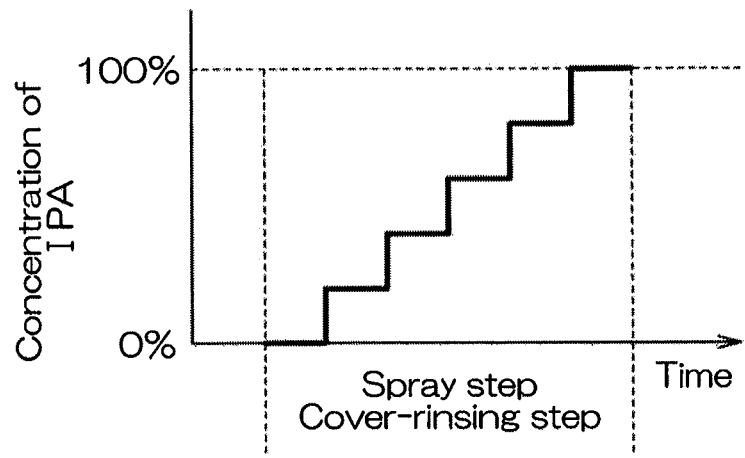
FIG. 8 is a graph showing one example of time-dependent changes of the concentration of IPA in a mixed liquid.

FIG. 8 is a graph showing one example of time-dependent changes of the concentration of IPA in a mixed liquid. The thick line of FIG. 8 shows an example in which the concentration of IPA stepwisely increases. The concentration of IPA at the start time of the spray cleaning may be 0%, or may be a value other than 0. Likewise, the concentration of IPA at the end time of the spray cleaning step may be 100%, or may be a value other than 100. Additionally, the concentration of IPA may continuously or stepwisely decrease with the lapse of time. The maximum value and the minimum value of the concentration of IPA are determined in accordance with a substrate W to be processed.

In a case in which the concentration of IPA is raised, it is possible to make the consumption of IPA smaller while maintaining equal quality than in a case in which the concentration of IPA is high from the start. Additionally, the concentration of IPA residing on the substrate W also rises with the lapse of time, and thus it is possible to continue to supply a liquid, which has a high affinity for a liquid in a pattern, to the substrate W. If a difference in concentration between the liquid in the pattern and the liquid to be supplied to the substrate W is great, there is a possibility that the liquid in the pattern will not be replaced easily and smoothly. Thus, by raising the concentration of IPA residing on the substrate W with the lapse of time, it is possible to smoothly replace the liquid in the pattern by the liquid supplied from the spray nozzle 21 and from the cover-rinsing liquid nozzle 26.

When the concentration of IPA in the mixed liquid is changed, the diameter of the liquid droplet generated by the spray nozzle 21 changes. Additionally, the concentration of IPA in the mixed liquid to be supplied to the substrate W also changes. A manner in which foreign matters adhere to the substrate W is not immutable inmost cases, and includes various modes. Additionally, there is also a case in which foreign matters variously different in size or in kind adhere to the substrate W. Thus, it is possible to raise the removal rate of the foreign matters by changing the concentration of IPA when the same substrate W is processed. Additionally, when a plurality of patterns that mutually differ in aspect ratio are formed on the front surface of the substrate W, it is possible to perform optimal processing with respect to any pattern.

Figure 9:
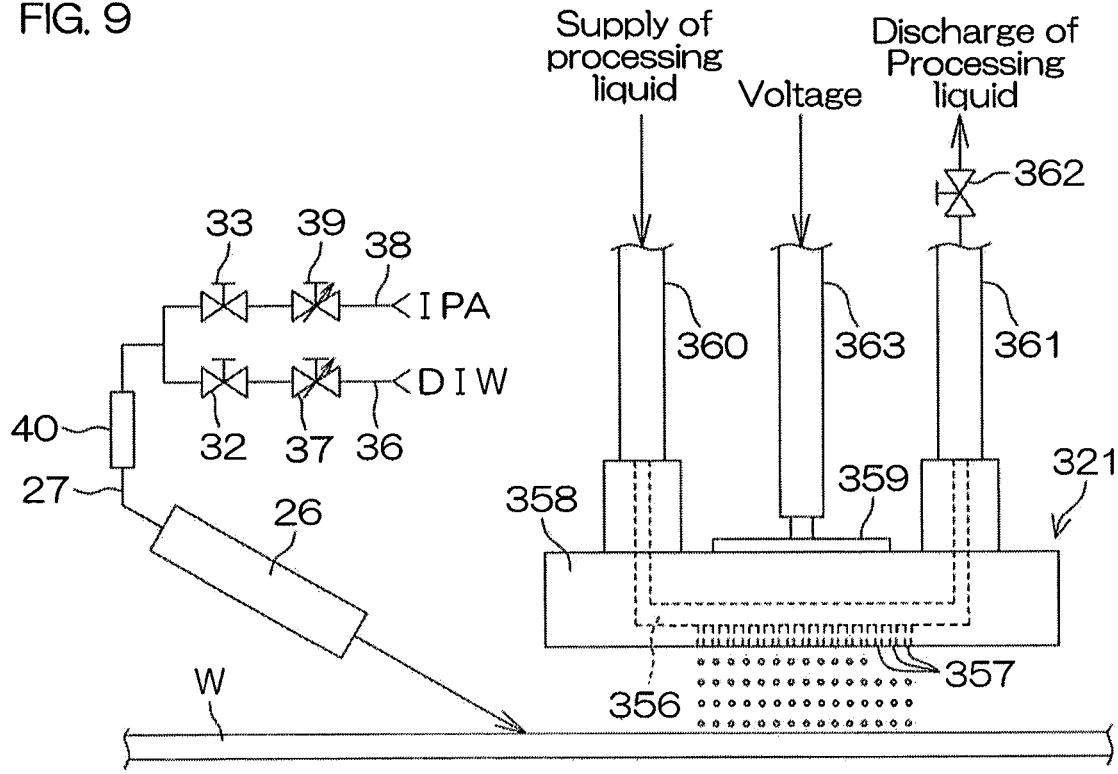
FIG. 9 is a schematic view of a spray nozzle and a cover-rinsing liquid nozzle, which are horizontally viewed, according to another preferred embodiment of the present invention.

Although a description has been given of the aforementioned preferred embodiment in which the spray nozzle 21 is a two-fluid nozzle, the spray nozzle 21 may be a nozzle other than the two-fluid nozzle. As shown in FIG. 9, the spray nozzle 321 may generate a plurality of liquid droplets by simultaneously jetting a liquid from a plurality of discharge ports 357.

The spray nozzle 321 shown in FIG. 9 includes a nozzle body 358 in which a processing-liquid flow passage 356 and a plurality of discharge ports 357 are provided and a piezoelectric device 359 that divides a processing liquid discharged from the plurality of discharge ports 357 into liquid parts by applying vibrations to the nozzle body 358. The upstream end of the processing-liquid flow passage 356 is connected to a processing-liquid supply piping 360 that guides a processing liquid supplied to the processing-liquid flow passage 356. The downstream end of the processing-liquid flow passage 356 is connected to a processing-liquid discharge piping 361 that guides a processing liquid discharged from the processing-liquid flow passage 356. A wire 363 that applies a voltage to the piezoelectric device 359 is connected to the piezoelectric device 359.

When a discharge valve 362 interposed in the processing-liquid discharge piping 361 is closed, a processing liquid is jetted downwardly from the plurality of discharge ports 357. When the piezoelectric device 359 vibrates in this state, the processing liquid jetted from the plurality of discharge ports 357 is divided, and a plurality of liquid droplets are generated. The processing liquid supplied from the processing-liquid supply piping 360 to the processing-liquid flow passage 356 may be a mixed liquid of pure water and IPA, or may be a liquid other than the mixed liquid. For example, only pure water may be supplied to the processing-liquid flow passage 356. FIG. 9 shows an example in which a processing liquid is supplied to the spray nozzle 321, and a mixed liquid of pure water and IPA is supplied to the cover-rinsing liquid nozzle 26.

Although a description has been given of the aforementioned preferred embodiment in which a mixed liquid having room temperature is supplied to the spray nozzle 21 and to the cover-rinsing liquid nozzle 26, a mixed liquid having a temperature higher or lower than the room temperature may be supplied to the spray nozzle 21 and to the cover-rinsing liquid nozzle 26. For example, a heater 364 (see FIG. 1) may be provided that heats pure water to be supplied from the first piping 36 to the mixing valve 31 at a temperature higher than the room temperature.

According to this arrangement, warm water (heated pure water) is supplied from the first piping 36 to the mixing valve 31, and thus the temperature of the mixed liquid to be supplied to the spray nozzle 21 and to the cover-rinsing liquid nozzle 26 rises. The surface tension of the mixed liquid is lowered by this temperature rise. Thus, it is possible to lower the surface tension of the mixed liquid of pure water and IPA without increasing the ratio of IPA included in the mixed liquid.

Although a description has been given of the aforementioned preferred embodiment in which the concentration and the temperature of a mixed liquid to be supplied to the spray nozzle 21 are equal to the concentration and the temperature of a mixed liquid to be supplied to the cover-rinsing liquid nozzle 26, respectively, at least one of the concentration and the temperature is not necessarily required to be equal thereto.

Although a description has been given of the aforementioned preferred embodiment in which a mixed liquid of pure water and IPA is supplied to both the spray nozzle 21 and the cover-rinsing liquid nozzle 26, a liquid (e.g., pure water) other than this mixed liquid of pure water and IPA may be supplied to either the spray nozzle 21 or the cover-rinsing liquid nozzle 26.

Although a description has been given of the aforementioned preferred embodiment in which pure water and IPA are separately supplied to the mixing valve 31, a mixed liquid of pure water and IPA may be supplied from one of the first and second pipings 36 and 38 to the mixing valve 31. If the concentration of IPA is required to be adjusted, it is recommended to add pure water or IPA from the other one of the first and second pipings 36 and 38 to the mixing valve 31.

Although a description has been given of the aforementioned preferred embodiment in which the mixer 40 is disposed both in the liquid piping 22 and in the cover-rinsing liquid piping 27, one of or both of the mixers 40 may be excluded.

Although a description has been given of the aforementioned preferred embodiment in which the spray nozzle 21 and the cover-rinsing liquid nozzle 26 are held by the same nozzle arm 29, the spray nozzle 21 and the cover-rinsing liquid nozzle 26 may be held by different nozzle arms, respectively. The cover-rinsing liquid nozzle 26 may be excluded.

Although a description has been given of the aforementioned preferred embodiment in which the rinse liquid discharged from the rinse liquid nozzle 16 is pure water, the rinse liquid may be a mixed liquid of pure water and IPA.

Although a description has been given of the aforementioned preferred embodiment in which the substrate processing apparatus 1 is an apparatus that processes a disk-shaped substrate W, the substrate processing apparatus 1 may be an apparatus that processes a polygonal substrate W.

Two or more of any of the arrangements described above may be combined. Two or more of any of the steps described above may be combined.

The present application corresponds to Japanese Patent Application No. 2016-026111 filed on Feb. 15, 2016 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method that causes a plurality of liquid droplets to collide with a substrate, the plurality of liquid droplets generated from a mixed liquid for liquid droplets in which a chemical liquid is mixed at a concentration for liquid droplets, the chemical liquid having a smaller surface tension than water and having a hydrophilic group and a hydrocarbon group, the mixed liquid including water and the chemical liquid, the substrate processing method comprising:
   a mixed-liquid-for-liquid-droplets supplying step of supplying a spray nozzle, which generates the plurality of liquid droplets, with the mixed liquid for liquid droplets having the concentration for liquid droplets determined in accordance with a substrate to be processed by changing the concentration for liquid droplets to a value determined in accordance with the substrate to be processed;
   a liquid-droplets generating step of generating the plurality of liquid droplets, each having diameter suitable for the substrate to be processed, from the mixed liquid for liquid droplets supplied to the spray nozzle in the mixed-liquid-for-liquid-droplets supplying step;
   a liquid-droplets collision step of allowing the plurality of liquid droplets generated in the liquid-droplets generating step to collide with the substrate;
   a mixed-liquid-for-cover-rinsing supplying step of supplying a mixed liquid for cover-rinsing in which a chemical liquid different from water is mixed at a concentration for cover-rinsing to a cover-rinsing liquid nozzle, the mixed liquid including water and the chemical liquid having a hydrophilic group and a hydrocarbon group; and
   a cover-rinsing step of allowing the cover-rinsing liquid nozzle to discharge the mixed liquid for cover-rinsing supplied in the mixed-liquid-for-cover-rinsing supplying step toward the substrate in parallel with the liquid-droplets collision step,
   wherein the mixed-liquid-for-cover-rinsing supplying step is a step of supplying the mixed liquid for cover-rinsing having the concentration for cover-rinsing determined in accordance with the substrate to be processed to the cover-rinsing liquid nozzle, and
   the concentration for cover-rinsing determined in accordance with the substrate to be processed is equal to the concentration for liquid droplets determined in accordance with the substrate to be processed.

2. The substrate processing method according to claim 1, wherein
   the mixed-liquid-for-liquid-droplets supplying step includes:

a first mixing step of generating the mixed liquid for liquid droplets by mixing the water and the chemical liquid together by a first mixing unit; and a second mixing step of mixing the mixed liquid for liquid droplets generated in the first mixing step by a second mixing unit that differs from the first mixing unit and that is disposed on an upstream side of the spray nozzle.

3. The substrate processing method according to claim 1, further comprising a storing step of storing a recipe that includes contents of substrate processing and a processing procedure, wherein the mixed-liquid-for-liquid-droplets supplying step is a step of supplying the mixed liquid for liquid droplets having the concentration for liquid droplets included in the recipe to the spray nozzle.

4. The substrate processing method according to claim 1, further comprising:

a storing step of storing a table for liquid droplets, the table including a plurality of pieces of substrate information that represents information about a substrate to be processed and the concentrations for liquid droplets that correspond to the plurality of pieces of substrate information, respectively;

a communication step of receiving the substrate information; and a concentration selecting step of selecting the concentration for liquid droplets that corresponds to the substrate information received in the communication step, as the concentration for liquid droplets determined in accordance with the substrate to be processed, from among the concentrations for liquid droplets included in the table for liquid droplets;

wherein the mixed-liquid-for-liquid-droplets supplying step is a step of supplying the mixed liquid for liquid droplets having the concentration for liquid droplets selected in the concentration selecting step to the spray nozzle.

5. The substrate processing method according to claim 1, wherein the mixed-liquid-for-liquid-droplets supplying step is a step of changing the concentration for liquid droplets within a range determined in accordance with the substrate to be processed while supplying the mixed liquid for liquid droplets to the spray nozzle.

6. The substrate processing method according to claim 1, further comprising a heating step of raising a temperature of the mixed liquid for liquid droplets to be supplied to the spray nozzle in the mixed-liquid-for-liquid-droplets supplying step by heating at least one of the water and the chemical liquid before or after the water and the chemical liquid are mixed together.

7. The substrate processing method according to claim 1, the substrate processing method being a method that causes the plurality of liquid droplets to collide with a substrate that has undergone dry etching.

8. The substrate processing method according to claim 1, wherein the mixed-liquid-for-liquid-droplets supplying step is a step of supplying the spray nozzle with the mixed liquid for liquid droplets having the concentration for liquid droplets determined in accordance with the substrate to be processed, while increasing the concentration for liquid droplets in a stepwise manner.

9. The substrate processing method according to claim 1, wherein the mixed-liquid-for-liquid-droplets supplying step is a step of supplying the spray nozzle with the mixed liquid for liquid droplets having the concentration for liquid droplets determined in accordance with the substrate to be processed based on at least one of a removal rate of particles, a number of damage occurrences, and a removal rate of residues.

10. The substrate processing method according to claim 1, further comprising a mixing step of mixing the water and the chemical liquid at a mixing unit and supplying the spray nozzle and the cover-rinsing liquid nozzle with the water and the chemical liquid mixed at the mixing unit as the mixed liquid for liquid droplets and the mixed liquid for cover-rinsing.

11. A substrate processing method that causes a plurality of liquid droplets to collide with a substrate that has undergone dry etching, the plurality of liquid droplets generated from a mixed liquid for liquid droplets in which a chemical liquid is mixed at a concentration for liquid droplets, the chemical liquid having a smaller surface tension than water and having a hydrophilic group and a hydrocarbon group, the mixed liquid including water and the chemical liquid, the substrate processing method comprising:

a mixed-liquid-for-liquid-droplets supplying step of supplying a spray nozzle, which generates the plurality of liquid droplets, with the mixed liquid for liquid droplets having the concentration for liquid droplets determined in accordance with a substrate to be processed by changing the concentration for liquid droplets to a value determined in accordance with the substrate to be processed;

a liquid-droplets generating step of generating the plurality of liquid droplets, each having diameter suitable for the substrate to be processed, from the mixed liquid for liquid droplets supplied to the spray nozzle in the mixed-liquid-for-liquid-droplets supplying step; and a liquid-droplets collision step of allowing the plurality of liquid droplets generated in the liquid-droplets generating step to collide with the substrate, wherein the mixed-liquid-for-liquid-droplets supplying step is a step of supplying the spray nozzle with the mixed liquid for liquid droplets having the concentration for liquid droplets determined in accordance with the substrate to be processed based on at least one of a removal rate of particles, the number of damage occurrences, and a removal rate of residues.

12. The substrate processing method according to claim 11, further comprising a heating step of raising a temperature of the mixed liquid for liquid droplets to be supplied to the spray nozzle in the mixed-liquid-for-liquid-droplets supplying step by heating at least one of the water and the chemical liquid before or after the water and the chemical liquid are mixed together.

* * * * *